(12) United States Patent
Watanabe et al.

(10) Patent No.: US 11,502,234 B2
(45) Date of Patent: Nov. 15, 2022

(54) LIGHT-EMITTING-ELEMENT-EQUIPPED SUBSTRATE AND BACKLIGHT

(71) Applicant: SHARP KABUSHIKI KAISHA, Sakai (JP)

(72) Inventors: Hisashi Watanabe, Sakai (JP); Hirotoshi Yasunaga, Sakai (JP); Youzou Kyoukane, Sakai (JP); Takeshi Masuda, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 97 days.

(21) Appl. No.: 17/193,444

(22) Filed: Mar. 5, 2021

(65) Prior Publication Data

US 2021/0288234 A1 Sep. 16, 2021

Related U.S. Application Data

(60) Provisional application No. 62/989,090, filed on Mar. 13, 2020.

(51) Int. Cl.
*H01L 33/62* (2010.01)
*G02F 1/13357* (2006.01)
*H01L 33/56* (2010.01)
*H01L 33/54* (2010.01)

(52) U.S. Cl.
CPC ........ *H01L 33/62* (2013.01); *G02F 1/133603* (2013.01); *H01L 33/54* (2013.01); *H01L 33/56* (2013.01)

(58) Field of Classification Search
CPC ......... H01L 33/62; H01L 33/54; H01L 33/56; G02F 1/133603
See application file for complete search history.

(56) References Cited

FOREIGN PATENT DOCUMENTS

JP        2007053352 A      3/2007
WO   WO-2014141691 A1  *  9/2014  ............. H01L 24/32

* cited by examiner

*Primary Examiner* — Mary Ellen Bowman
(74) *Attorney, Agent, or Firm* — ScienBiziP, P.C.

(57) ABSTRACT

A light-emitting-element-equipped substrate includes: a circuit substrate including a main surface; a light-emitting element mounted on the main surface and electrically connected to the circuit substrate; a silicone-based white resist layer covering the main surface and including: a first opening surrounding the light-emitting element; and a second opening different from the first opening; and a transparent protective layer covering the light-emitting element, the silicone-based white resist layer, and the second opening.

19 Claims, 5 Drawing Sheets

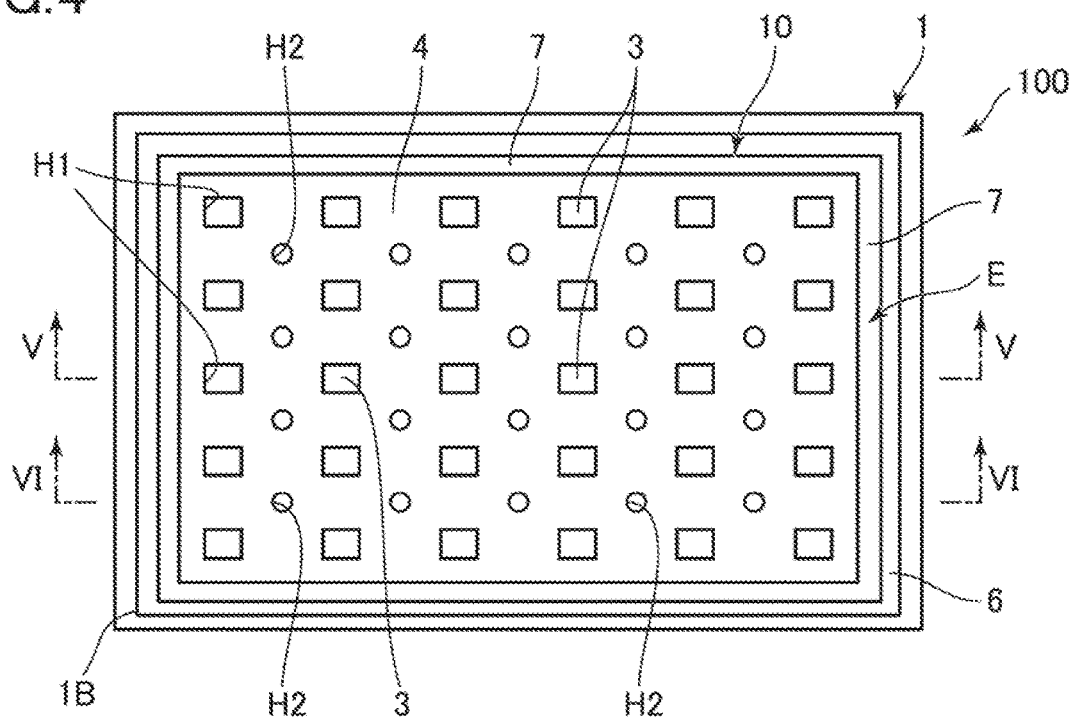
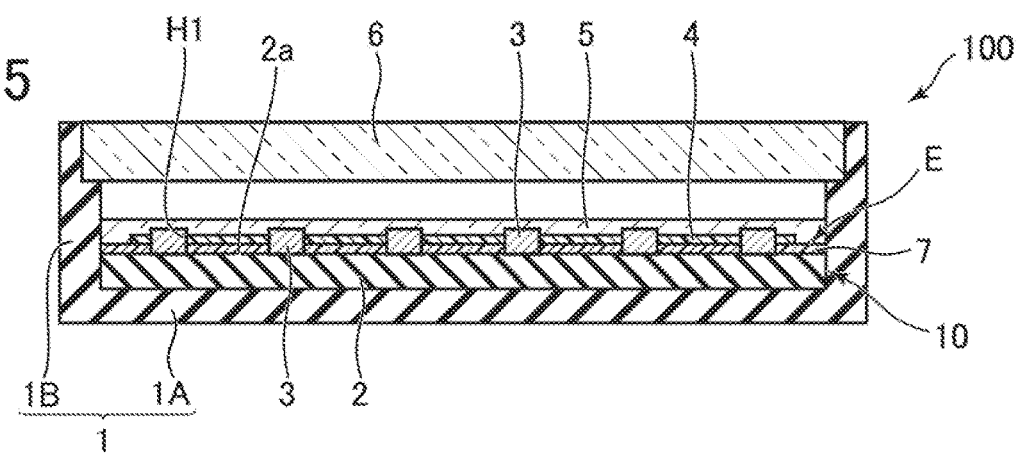
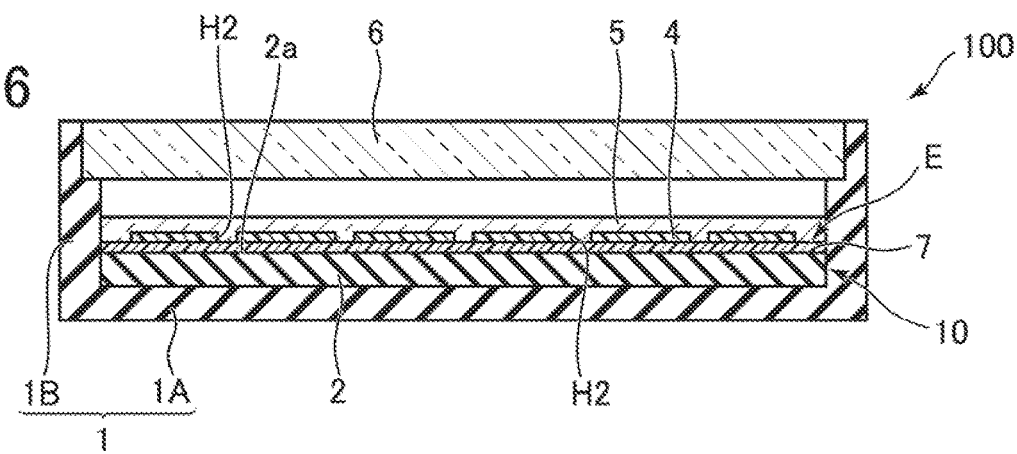

LIGHT-EMITTING-ELEMENT-EQUIPPED SUBSTRATE AND BACKLIGHT

TECHNICAL FIELD

The present disclosure relates to a light-emitting-element-equipped substrate an backlight.

RELATED ART

Japanese Unexamined Patent Application Publication No. 2007-053352 discloses an example of a liquid crystal display device using a backlight. The backlight includes: a light-emitting diode (LED) as an example of a light-emitting element; and a circuit substrate printed with circuit wiring electrically connected to the LED. This circuit substrate has a main surface provided with a transparent protective layer to cover the LED and the circuit wiring. The protective layer protects the LED.

Furthermore, between the circuit substrate and the protective layer, a white resist layer is coated on the entire main surface of the circuit substrate to insulate copper foil of the circuit wiring and to increase reflectance of light to be emitted from the LED. The white resist layer is provided to cover the circuit wiring but not the LED. Hence, the white resist layer protects the circuit wiring, without blocking travel of the light to be emitted from the LED.

SUMMARY

The white resist layer described above is mainly an epoxy-based white resist layer. The epoxy-based white resist layer, however, discolors yellow because of aging degradation due to heat or light. Hence, the reflectance of the epoxy-based white resist layer decreases as time proceeds. As a result, when a substrate equipped with a light-emitting element is used for a long time period as, for example, a backlight of a liquid crystal display device, the liquid crystal display device suffers decrease and unevenness in brightness.

Thus, recently, a technique is under study for providing a silicone-based white resist layer, having high heat resistance and suffering very little aging degradation, between a circuit substrate and a protective layer. Ig the silicone-based white resist layer is provided between the protective layer and the circuit substrate, however, the protective layer and the circuit substrate easily delaminate from each other. This is because the silicone-based white resist layer is extremely poor in adhesion to another material. If, for example, an acryl-based protective layer or an epoxy-based protective layer is formed on the silicone-based white resist layer, the resist layer and the protective layer easily delaminate from each other.

The present disclosure is devised in view of the above problems. An object of the present disclosure is to provide a light-emitting-element-equipped substrate and a backlight capable of curbing decrease and unevenness in brightness, while reducing the risk of delaminating a protective layer and a circuit substrate from each other.

SOLUTION TO PROBLEM (1) A light-emitting-element-equipped substrate according to the present disclosure includes: a circuit substrate including a main surface; a light-emitting element mounted on the main surface and electrically connected to the circuit substrate; a silicone-based white resist layer covering the main surface and including: a first opening surrounding the light-emitting element; and a second opening different from the first opening; and a transparent protective layer covering the light-emitting element, the silicone-based white resist layer, and the second opening.

(2) A light-emitting-element-equipped substrate according to the present disclosure is that according to the item (1). The second opening is spaced apart from the light-emitting element over a predetermined distance.

(3) A light-emitting-element-equipped substrate according to the present disclosure is that according to the item (2). Four light-emitting elements including the light-emitting element are each positioned in a corresponding one of imaginary corners of an imaginary rectangle in plan view, and the second opening is provided in a region including an intersection of diagonals connecting center points of the four light-emitting elements.

(4) A light-emitting-element-equipped substrate according to the present disclosure is that according to the item (2) or (3). The second opening is provided in a region including a midpoint between center points of two light-emitting elements including the light-emitting clement and adjacent to each other.

(5) A light-emitting-element-equipped substrate according to the present disclosure is that according to any one of the items (2) to (4). A plurality of the second openings are latticed overall.

(6) A light-emitting-element-equipped substrate according to the present disclosure is that according to any one of the items (1) to (5). The circuit substrate and the transparent protective layer are in direct contact with each other in a region inside the second opening.

(7) A light-emitting-element-equipped substrate according to the present disclosure is that according to any one of the items (1) to (6). The light-emitting-element-equipped substrate further includes a non-silicone-based white resist layer between the silicone-based white resist layer and the circuit substrate. The non-silicone-based white resist layer is found in a region inside the second opening in plan view.

(8) A light-emitting-element-equipped substrate according to the present disclosure is that according to the item (7). The non-silicone-based white resist layer is greater in strength to adhere the circuit substrate and the protective layer together than the silicone-based white resist layer.

(9) A light-emitting-element-equipped substrate according to the present disclosure is that according to the item (7) or (8). The non-silicone-based white resist layer is higher in light reflectance than the main surface.

(10) A light-emitting-element-equipped substrate according to the present disclosure is that according to any one of the items (7) to (9). The non-silicone-based white resist layer includes an epoxy-based white resist layer.

(11) A light-emitting-element-equipped substrate according to the present disclosure is that according to any one of the items (1) to (10). The silicone-based white resist layer is provided only to an interior region positioned inside a frame region of the circuit substrate.

(12) A light-emitting-element-equipped substrate according to the present disclosure is that according to the item (11). In the frame region, the circuit substrate and the protective layer are in direct contact with each other.

(13) A light-emitting-element-equipped substrate according to the present disclosure is that according to the item (11) or (12). The light-emitting-element-equipped substrate further includes a non-silicone-based white resist layer between the circuit substrate and the protective layer. The non-silicone-based white resist layer is found in the frame region in plan view.

(14) A light-emitting-element-equipped substrate according to the present disclosure is that according to any one of the items (1) to (13). The main surface of the circuit substrate is curved.

(15) A light-emitting-element-equipped substrate according to the present disclosure is that according to any one of the items (1) to (14). The circuit substrate includes glass epoxy, polyimide, or aluminum.

(16) A light-emitting-element-equipped substrate according to the present disclosure is that according to any one of the items (1) to (15). The protective layer includes an acryl-based, epoxy-based, silicone-based, or urethane-based transparent resin layer.

(17) A backlight according to the present disclosure includes: a frame including: a bottom face; a peripheral wall standing from an outer periphery of the bottom face to surround the bottom face; and a protrusion protruding inward from the peripheral wall; and the light-emitting-element-equipped substrate provided between the bottom face and the protrusion.

(18) A backlight according to the present disclosure includes: a frame including: a bottom face; a peripheral wall standing from an outer periphery of the bottom face to surround the bottom face; and a protrusion protruding inward from the peripheral wall; and the light-emitting-element-equipped substrate provided between the bottom face and the protrusion. (18) A backlight according to the present disclosure is that according to the item (17). The light-emitting-element-equipped substrate is sandwiched between the protrusion and the bottom face.

(19) A backlight according to the present disclosure is that according to the item (17) or (18). The backlight further includes an optical sheet provided above the protrusion and changing light emitted from the light-emitting element to an area light source.

Figure 1:
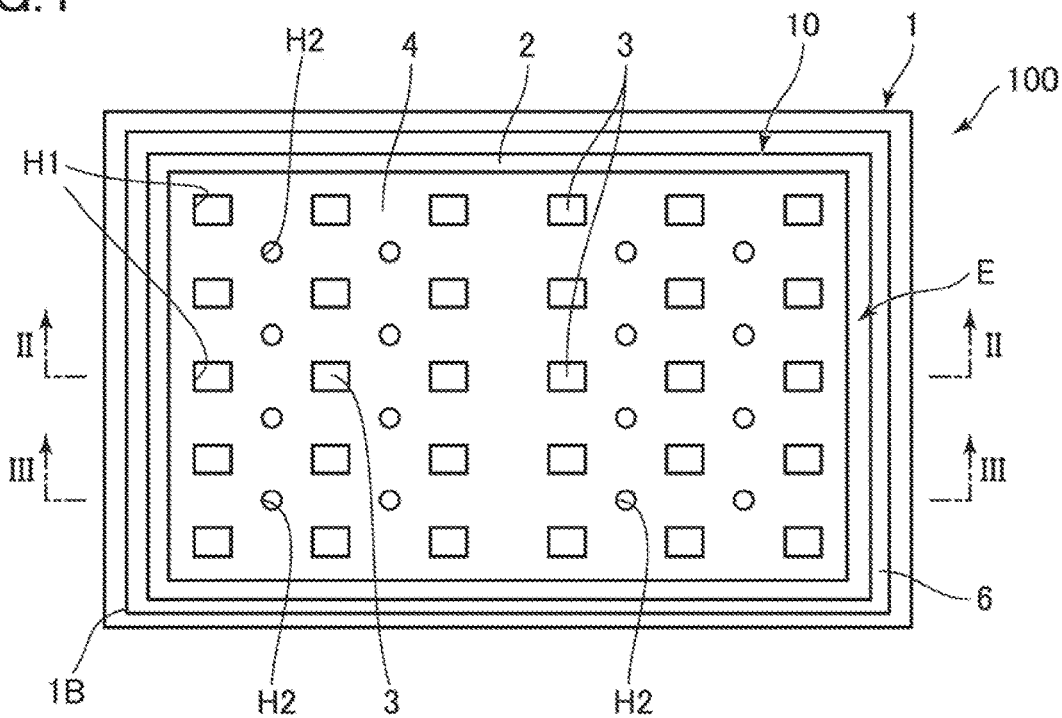
FIG. 1 is a plan view of a backlight including a light-emitting-element-equipped substrate according to a first embodiment.

FIG, 2 is a cross-sectional view taken along line II-II of FIG. 1.

Figure 3:
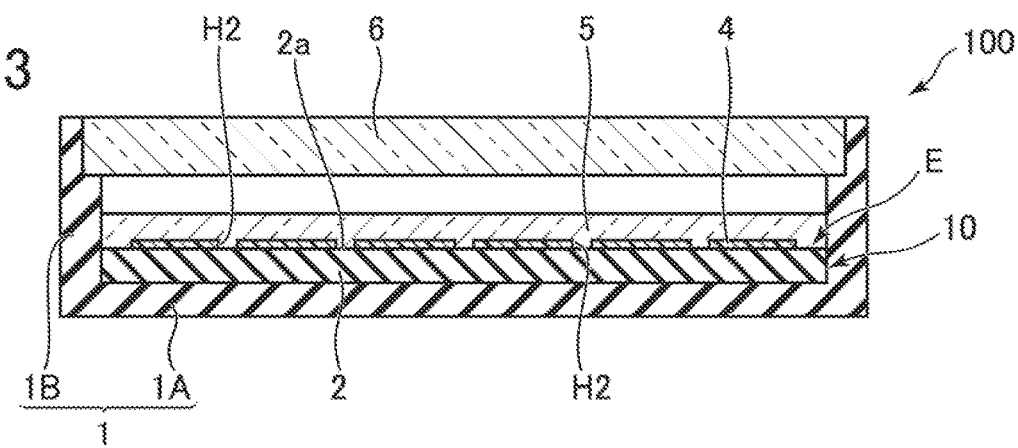

FIG. 3 is a cross-sectional view taken along line III-III of FIG. 1.

FIG. 4 is a plan view of the backlight including the light-emitting-element-equipped substrate according to a second embodiment.

FIG. 5 is a cross-sectional view taken along line V-V of FIG. 4.

FIG. 6 is a cross-sectional view taken along line VI-VI of FIG. 4.

Figure 7:
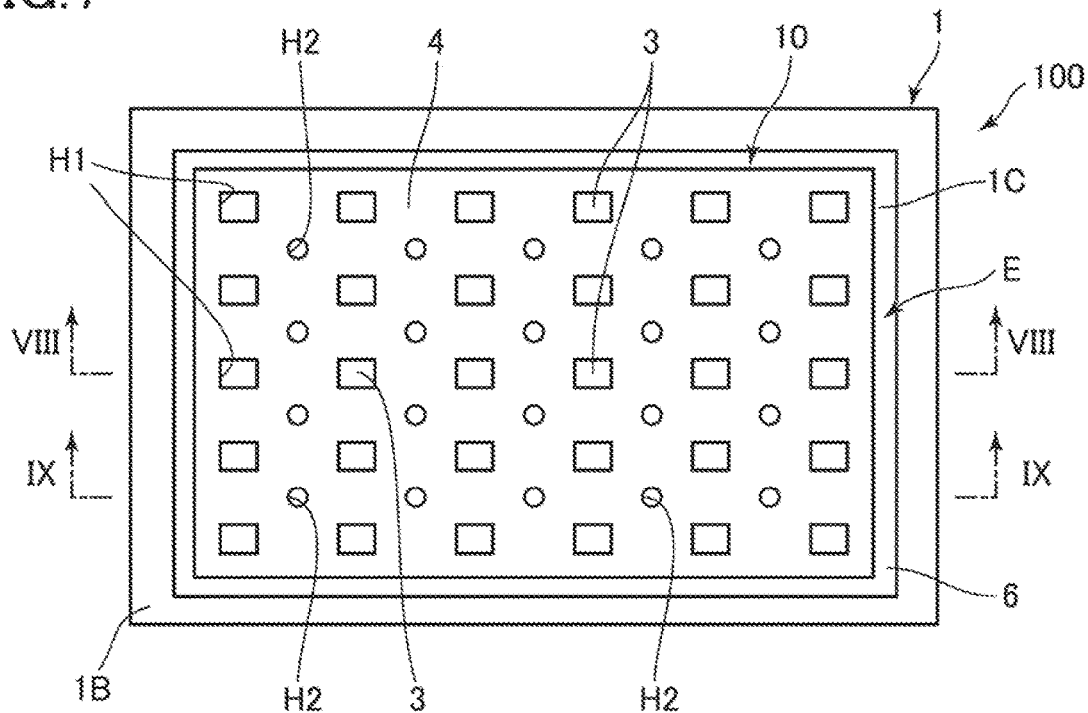

FIG. 7 is a plan view of the backlight including the light-emitting-element-equipped substrate according to a third embodiment.

Figure 8:
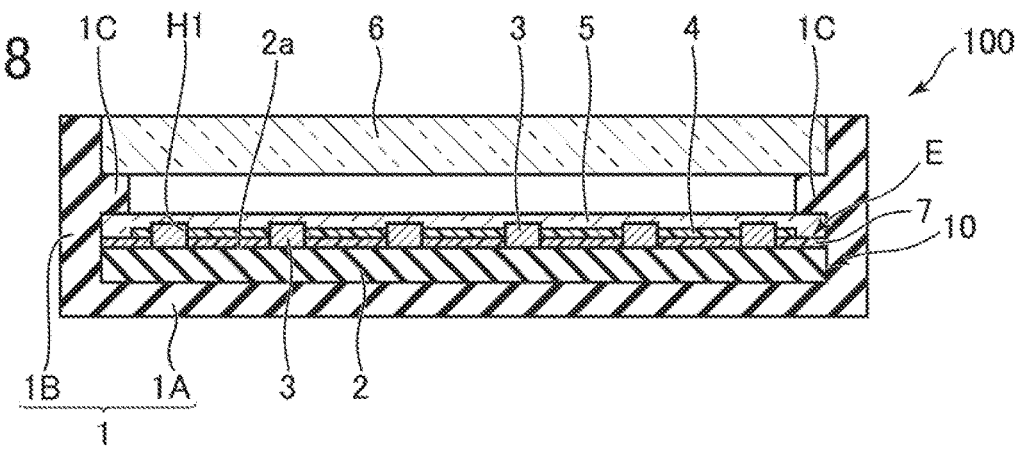

FIG. 8 is a cross-sectional view taken along line VIII-VIII of FIG. 7.

Figure 9:
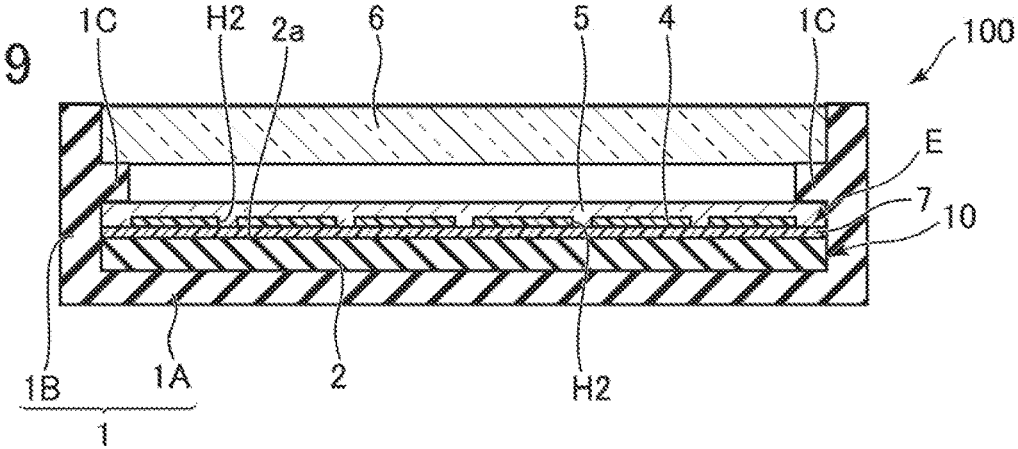

FIG. 9 is a cross-sectional view taken along line IX-IX of FIG. 7.

Figure 10:
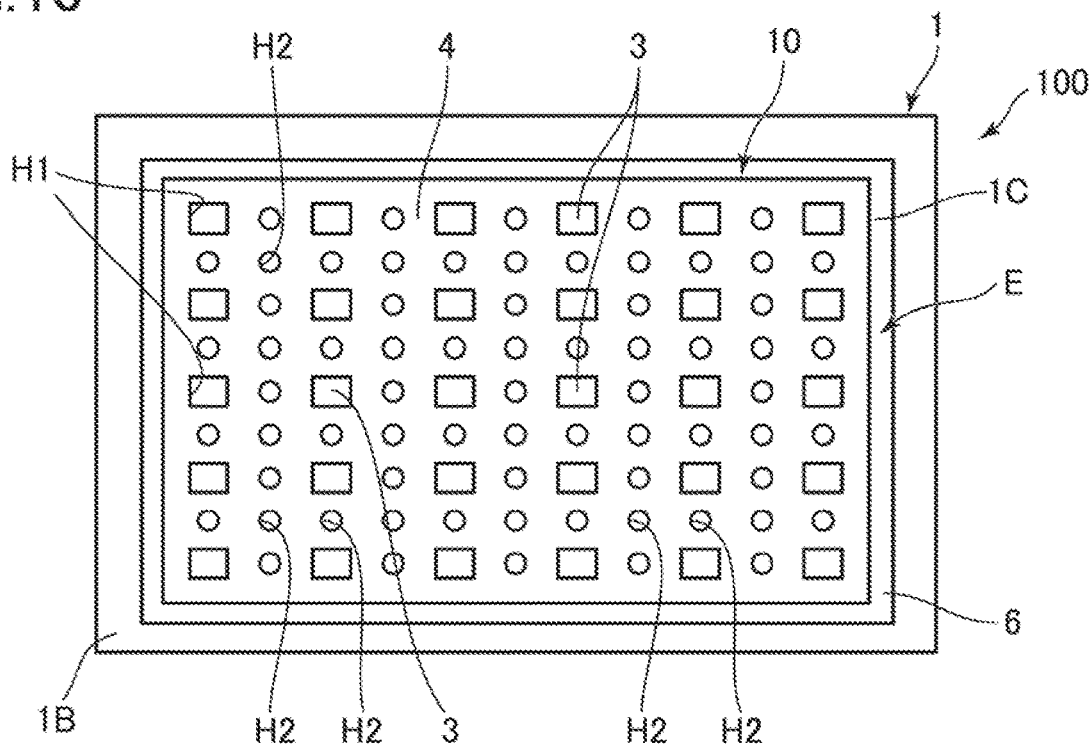

FIG. 10 is a plan view of the backlight including the light-emitting-element-equipped substrate according to a fourth embodiment.

Figure 11:
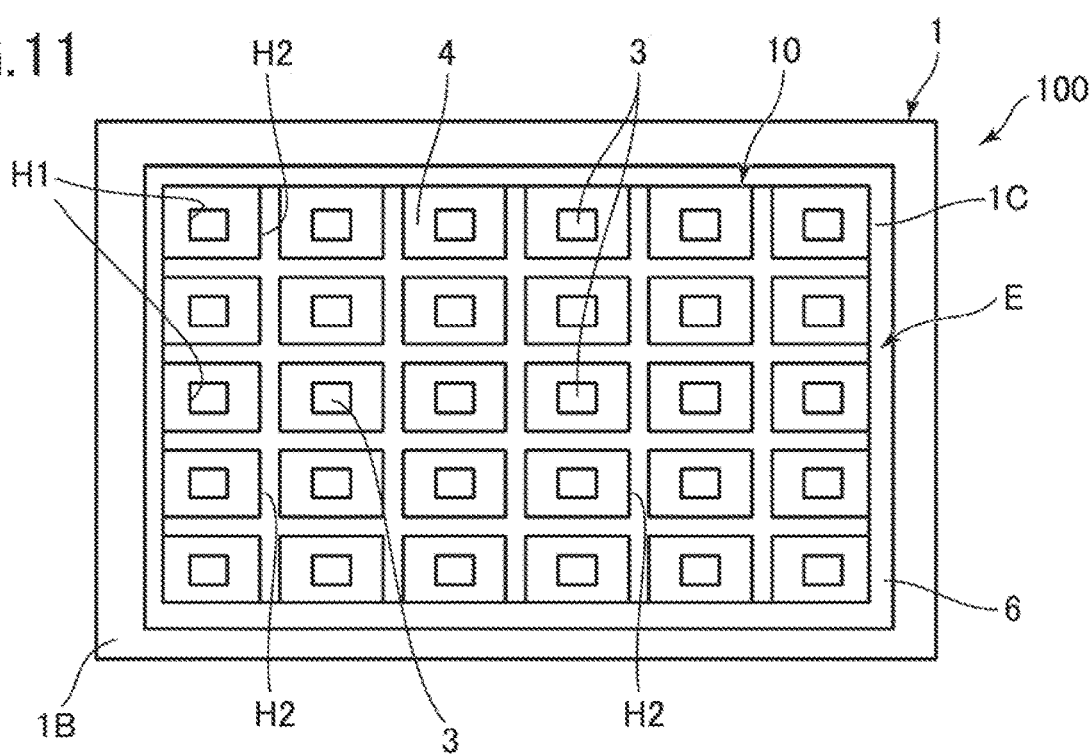

FIG. 11 is a plan view of the backlight including the light-emitting-element-equipped substrate according to a fifth embodiment.

Figure 12:
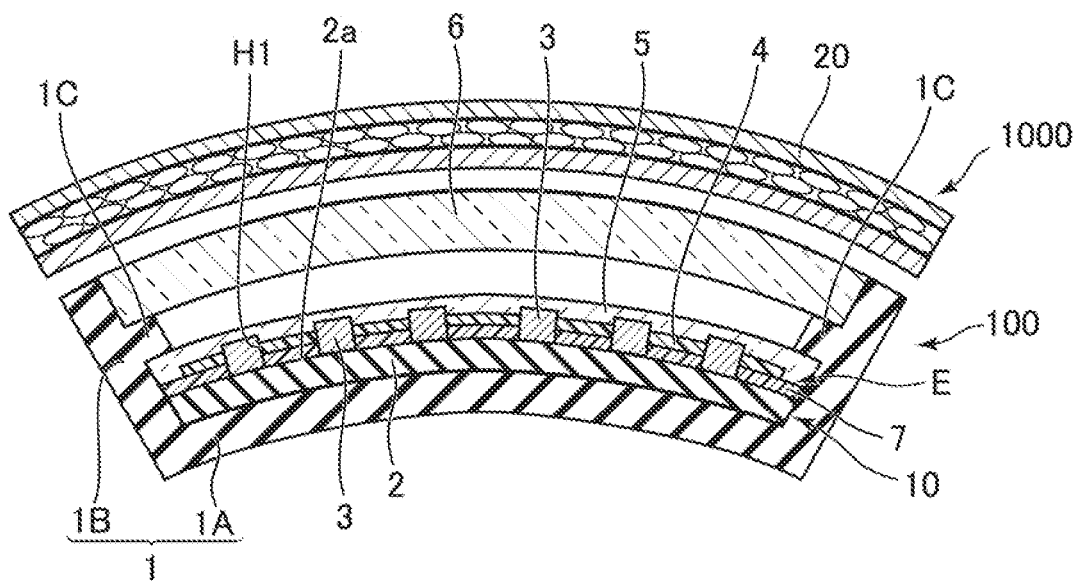

FIG. 12 is a first cross-sectional view of a liquid crystal display device equipped with the backlight including the light-emitting-element-equipped substrate according to a sixth embodiment.

Figure 13:
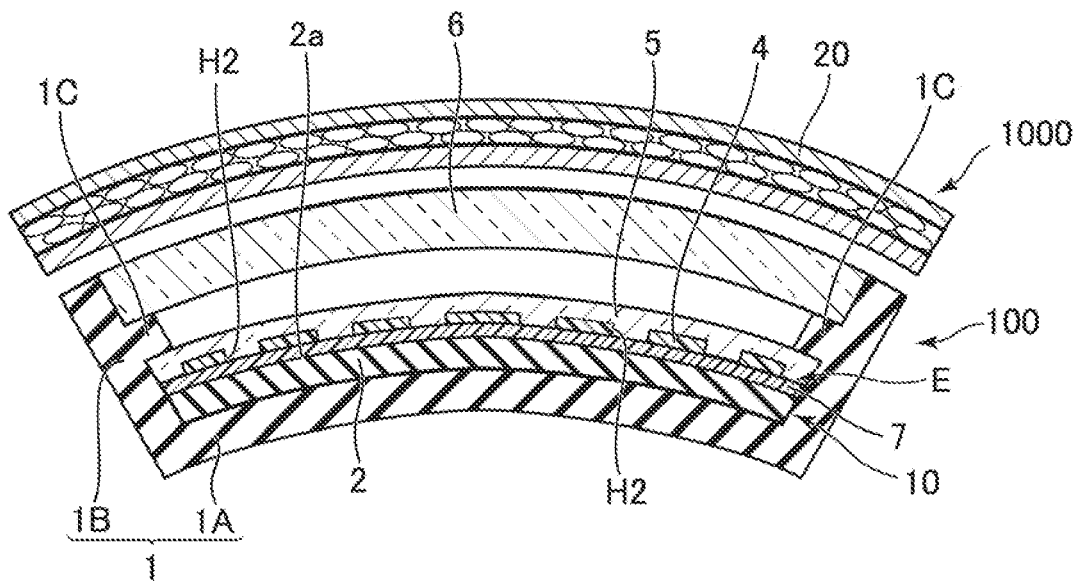

FIG. 13 is a second cross-sectional view of the liquid crystal display device equipped with the backlight including the light-emitting-element-equipped substrate according to the sixth embodiment.

EMBODIMENTS

Described below is a backlight including a light-emitting-element-equipped substrate according to embodiments of the present disclosure. Note that identical reference numerals are used to denote identical or substantially identical components throughout the drawings. Such components will not be repeatedly elaborated upon.

First Embodiment

Described below is a backlight 100 including a light-emitting-element-equipped substrate 10 according to a first embodiment, with reference to FIGS. 1 to 3.

Figure 2:
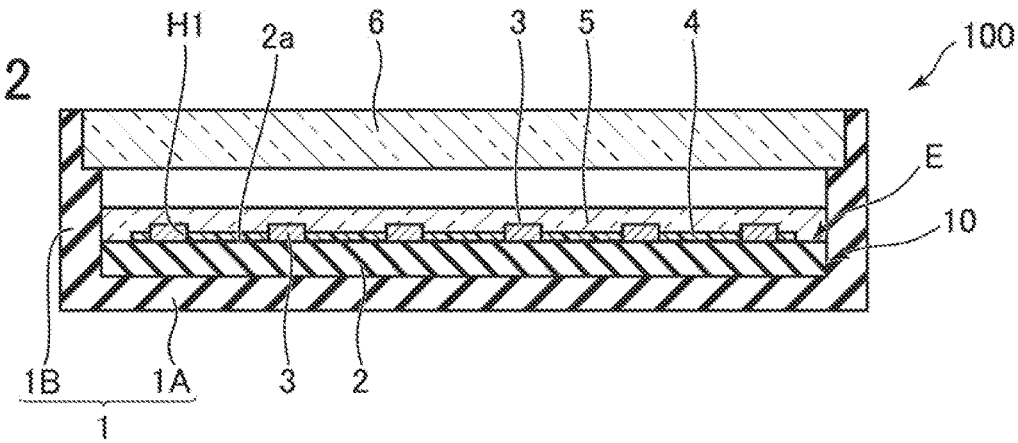

As illustrated in FIGS. 1 to 3, the backlight 100 includes a frame 1. The frame 1 is used to hold an optical sheet 6 to be described later. The frame 1 is formed of, for example, a highly reflective resin shaped with a mold. A typical example material of the frame 1 includes white polycarbonate.

The frame 1 includes: a bottom face 1A; and a peripheral wall 1B standing from an outer periphery of the bottom face 1A. The backlight 100 includes the optical sheet 6 attached to an upper end of the peripheral wall 1B. The backlight 100 includes the light-emitting-element-equipped substrate 10 on the bottom face 1A.

The light-emitting-element-equipped substrate 10 includes: a circuit substrate 2; light-emitting elements 3, a silicone-based white resist layer 4; and a transparent protective layer 5.

The circuit substrate 2 includes a main surface 2a. Circuit wiring (not shown) is printed on the main surface 2a. Electrode pads (not shown) are provided on the main surface 2a and electrically connected to the circuit wiring. The circuit wiring is electrically connected to a power source (not shown) through a cable (not shown) connected to the circuit substrate 2.

The circuit substrate 2 is formed of such a base material as glass epoxy, polyimide or aluminum. The base material, which is high in adhesion to a transparent resin or a transparent adhesive layer, can achieve advantageous effects of sufficiently reducing the risk of the protective layer 5 to be described later &laminating from the circuit substrate 2.

The light-emitting elements 3 are spaced at predetermined regular intervals and arranged in a matrix on the main surface 2a of the circuit substrate 2. Each of the light-emitting elements 3 is electrically connected to the electric pads. Hence, the light-emitting elements 3 are electrically connected to the circuit substrate 2. Specifically, the light-emitting elements 3 are electrically connected to the circuit wiring (not shown) printed on the main surface 2a of the circuit substrate 2. Thus, the light-emitting elements 3 are supplied with electricity from the power source through the cable and the circuit wiring.

Each of the light-emitting elements 3 is a bare chip of an LED. Each light-emitting element 3 may also be a relatively small and packaged LED. Furthermore, each light-emitting element 3 may also be a bare chip of an LED that is not packaged. The light-emitting elements 3 may emit monochromatic light in white or blue. The light-emitting elements 3 may include a red light-emitting element 3, a green light-emitting element 3, and a blue light-emitting element 3. The light-emitting elements 3 may be mounted on the circuit substrate 2 in either face-up disposition or flip-chip disposition.

The silicone-based white resist layer 4 includes: first openings H1 each surrounding a corresponding one of the light-emitting elements 3; and second openings H2 different from the first openings H1. The first openings H1 are spaced at predetermined regular intervals and arranged in a matrix in lows and columns. The second openings H2 are also spaced at predetermined regular intervals and arranged in a matrix in lows and columns. The silicone-based white resist layer 4 covers the main surface 2a. Hence, the silicone-based white resist layer 4 covers the circuit wiring printed on the main surface 2a.

The transparent protective layer 5 covers the light-emitting elements 3, the silicone-based white resist layer 4, and the second openings H2. An example of the silicone-based white resist layer 4 to be used in this embodiment is a silicone-based white resist such as TAINEX® manufactured by Okitsumo Inc. The electrode pads (not show) on the circuit substrate 2 are also coated white (with a white resist such as the PSR-4000® manufactured by Taiyo Ink Mfg Co., Ltd.) to increase light reflectance.

The silicone-based white resist layer 4 described above is high in heat and light resistance, and thus shows little variation in such an optical property as reflectance even under a hostile environment in which, in particular, a vehicle-mounted display is exposed. Moreover, the silicone-based white resist layer 4 is as high in initial reflectance as another white resist.

The transparent protective layer 5 is formed in close contact with the main surface 2a of the circuit substrate 2. The transparent protective layer 5 reduces the risk of delaminating the light-emitting elements 3 from the circuit substrate 2, and keeps the light-emitting elements 3 from an impact.

An example of the transparent protective layer 5 to be used includes an acryl-based, epoxy-based, silicone-based, or urethane-based transparent resin layer. An example technique to be used to bring the transparent protective layer 5 into close contact with the circuit substrate 2 includes screen printing, ink-jet printing, or spray painting. Moreover, the transparent protective layer 5 may be formed of a light-transparent base material including a poly-ethylene terephthalate (PET), and a light-transparent adhesive layer including an acryl-based, epoxy-based, silicone-based, or urethane-based one provided on the base material. Note that a higher refractive index of the adhesive layer achieves such an advantageous effect as a greater light emission efficiency.

The optical sheet 6 is an optical member to change light emitted from a point light source such as the light-emitting elements 3 to an area light source, and to make the light uniform. Examples of the optical sheet 6 to be used as needed include a fluorescent sheet, a diffusion sheet, a prism sheet, and a polarized-reflective sheet.

The fluorescent sheet absorbs tight light emitted from a light-emitting element 3 and having a specific wavelength, while producing a color serving as a complementary color of the light having the specific wavelength. That is, the fluorescent sheet colors the emitting light white. For example, if the light-emitting elements 3 emit blue light, the fluorescent sheet to be used may be made of a fluorescent material dispersed into a resin and emitting yellow light.

In such a case, the fluorescent sheet may be made of fluorescent materials dispersed into a resin and emitting green light and red light. An example of the fluorescent sheet is a quantum dot enhancement film (QDEF) manufactured by 3M®. If the light-emitting elements 3 emit light rays of RGB, and if the light is colored white with any other technique, the fluorescent sheet may be omitted.

An example of the diffusion sheet to be used is a Sumipex opal plate manufactured by Sumitomo Chemical Co., Ltd. to reduce uneven emission of light from the backlight 100. Another example of the diffusion sheet to be used is the D114 (product name) manufactured by Tsujiden Co., Ltd. to reduce uneven emission of light from the backlight 100. An example of the prism sheet to be used is the BEF (product name) manufactured by 3M® to increase brightness. An example of the polarized-reflective sheet to be used is the DBEF (product name) manufactured by 3M® to increase brightness.

Typically, the optical sheet 6 is a multilayer of the fluorescent sheet, the diffusion sheet, the prism sheet, and the polarized-reflective sheet stacked on top of another in the stated order.

In the backlight 100 described above, the silicone-based white resist layer 4 having high heat resistance and suffering little aging degradation is provided between the circuit substrate 2 and the protective layer 5. Such a feature makes it possible to curb decrease and unevenness in brightness due to decrease in reflectance of the white resist layer 4.

Moreover, the white resist layer 4 includes the second openings H2. Hence, direct adhesion strength between the protective layer 5 and the circuit substrate 2 in a region inside each second opening H2 is greater than direct adhesion strength between the protective layer 5 and the circuit substrate 2 in a region in which the white resist layer 4 is provided. Consequently, such a feature can reduce the risk that the protective layer 5 and the circuit substrate 2 delaminate from each other, contributing to curbing decrease and unevenness in brightness while reducing the risk of protective layer 5 and the circuit substrate 2 delaminating from each other.

As can be seen in FIGS. 1 and 3, the second openings H2 are spaced apart from the light-emitting elements 3 over a predetermined distance. That is, each of the second openings H2 is not provided in a region within a predetermined distance from any other second opening H2. The predetermined distance is determined in accordance with required brightness, an intensity of light emitted from the light-emitting elements 3, adhesion strength between the protective layer 5 and the circuit substrate 2, and the light reflectance of the silicone-based white resist layer 4. When an OD is a distance between an upper face of the white resist layer 4 and a lower face of the optical sheet 6, adverse effects of the brightness and unevenness are less likely to appear if each of the second openings H2 is spaced apart from a corresponding one of the light-emitting elements 3 at the distance OD or farther. In this embodiment, for example, the OD is equal to, or longer than, a distance between the intersection of the diagonals of light-emitting elements 3 firming a rectangle in plan view and a corner of the rectangle. Hence, the first openings H1 and the second openings H2 are not formed integrally.

For example, in this embodiment, four of the light-emitting elements 3 are each positioned in a corresponding one of imaginary corners of an imaginary rectangle in plan view. Each of the second openings H2 is provided in a region including the intersection of the diagonals, of the imaginary rectangular, connecting center points of the four light-emitting elements 3. A center point of each of the light-emitting elements 3 shaped into a rectangle is the intersection of the diagonals of the rectangle. Such an arrangement of the second openings H2 makes it possible to reduce the risk of the protective layer 5 and the circuit substrate 2. delaminating from each other, while minimizing adverse effects to reflection of light emitted from each of the light-emitting elements 3.

As can be seen in FIG. 3, in this embodiment, the circuit substrate 2 and the protective layer 5 are in direct contact with each other in a region inside each of the second openings H2. Hence, materials other than the circuit substrate 2 and the protective layer 5 are not required for an increase in adhesion strength between the circuit substrate 2 and the protective layer 5. That is, taking advantage of the adhesion strength itself between the circuit substrate 2 and the protective layer 5, the risk of the circuit substrate 2 and the protective layer 5 delaminating from each other can be efficiently reduced.

As can be seen in FIGS. 1 to 3, the silicone-based white resist layer 4 is provided only to an interior region positioned inside a frame region E of the circuit substrate 2. As a result, the frame region E can be used as a region to increase an adhesive area between the circuit substrate 2 and the protective layer 5. Such a feature can further reduce the risk of the circuit substrate 2 and the protective layer 5 delaminating from each other.

As can be seen in FIGS. 2 and 3, in this embodiment, the circuit substrate 2 and the protective layer 5 are in direct contact with each other also in the frame region E. Hence, materials other than the circuit substrate 2 and the protective layer 5 are not required for an increase in adhesion strength between the circuit substrate 2 and the protective layer 5. Such a feature also takes advantage of the adhesion strength itself between the circuit substrate 2 and the protective layer 5, and makes it possible to effectively reduce the risk of the circuit substrate 2 and the protective layer 5 delaminating from each other.

As can be seen, in this embodiment, the silicone-based white resist layer 4 is not formed on the entire surface 2a of the circuit substrate 2. In other words, as seen in FIGS. 1 to 3, a region of an outer periphery of the circuit substrate 2 and a region between the light-emitting elements 3 are designated as regions in which the silicone-based white resist layer 4 is not formed. These regions are provided as non-forming regions. These non-forming regions are regions defined by the frame region E and the second openings H2.

Thanks to the non-forming regions, the main surface 2a of the circuit substrate 2 and the transparent protective layer 5, whose adhesion strength is higher than the adhesion strength of the circuit substrate 2 and the silicone-based white resist layer 4 or the adhesion strength of the transparent protective layer 5 and the silicone-based white resist layer 4, are in direct contact with each other. Such a feature can reduce the risk of delaminating the protective layer 5 from the circuit substrate 2. In such a case, the circuit substrate 2 preferably has high reflectance.

Note that the circuit substrate 2 can be made of a material having high reflectance such as the CS 3945 (product name) manufactured by Risho Kogyo Co., Ltd. or aluminum. In such a case, even if each of the second openings H2 is large, loss of light emitted from the light-emitting elements 3 is relatively small. As a matter of course, in the above case, the circuit substrate 2 is preferably designed so that no copper foil; namely, circuit wiring, is not found in the second openings H2.

Furthermore, even though the silicone-based white resist layer 4 having high durability is used, the circuit substrate 2 made of the above material can reduce the risk of delaminating the protective layer 5 from the circuit substrate 2. Consequently, such a feature makes it possible to reduce poor illumination of the light-emitting elements 3. Hence, the backlight 100 of this embodiment is useful in particular as a backlight of a vehicle-mounted liquid crystal display device.

Moreover, each of the second openings H2 is preferably spaced apart from the light-emitting elements 3 as much as possible. This is to minimize loss of light caused by exposure of the main surface 2a, of the circuit substrate 2, having low light reflectance. Hence, each second opening H2 is preferably provided in a region including a midpoint between the center points of the light-emitting elements 3 adjacent to each other.

Note that the size of the second openings H2 is determined appropriately, taking into consideration both a decrease in reflectance due to the exposure of the main surface 2a of the circuit substrate 2 and an increase in the adhesion strength between the protective layer 5 and the circuit substrate 2.

Second Embodiment

Described next is the backlight 100 including the light-emitting-element-equipped substrate 10 according to a second embodiment, with reference to FIGS. 4 to 6. Note that, in the description below, identical points between this embodiment and the first embodiment will not be repeated. The backlight 100 of this embodiment is different from that of the first embodiment in that the former further includes a non-silicone-based white resist layer 7 between the silicone-based white resist layer 4 and the circuit substrate 2.

In this embodiment, an example of the non-silicone-based white resist layer 7 is an epoxy-based white resist layer found on a region, of the main surface 2a of the circuit substrate 2, not provided with the silicone-based white resist layer 4. Hence, even if the reflectance of the main surface 2a of the circuit substrate 2 is low, the non-silicone-based white resist layer 7 increases the reflectance of the region not provided with the silicone-based white resist layer 4, thereby increasing the brightness of the backlight 100.

More specifically, the non-silicone-based white resist layer 7 is found in a region inside each second opening H2 in plan view. Hence, taking advantage of the second openings H2, reflectance of light can be further increased. Note that the non-silicone-based white resist layer 7 is preferably higher in light reflectance than the main surface 2a.

The non-silicone-based white resist layer 7 is greater in strength to adhere the circuit substrate 2 and the protective layer 5 together than the silicone-based white resist layer 4. Such a feature can more reliably reduce the risk of the circuit substrate 2 and the protective layer 5 delaminating from each other, while increasing reflectance of light emitted from the light-emitting elements 3.

The non-silicone-based white resist layer 4 includes an epoxy-based white resist layer 4. Hence, the above features can be achieved, using easily available materials.

Moreover, in the backlight 100 of this embodiment, the non-silicone-based white resist layer 7 is also found in the frame region E in plan view. Hence, even in the frame region E, reflectance of light emitted from the light-emitting elements 3 can be increased.

An example of the non-silicone-based white resist layer 7 includes the PSR-4000 LEW7S (product name) manufactured by Taiyo Ink Mfg Co., Ltd.

In the backlight 100 of this embodiment, the non-silicone-based white resist layer 7 is formed also in an exposed region of the main surface 2a of the circuit substrate 2. Such a feature can reduce loss of light emitted from the light-emitting elements 3. Note that the non-silicone-based white resist layer 7 is poor in durability. Hence, when exposed to a hostile environment, the non-silicone-based white resist layer 7 discolors yellow or suffers a decrease in light reflectance. Hence, in this embodiment, the non-silicone-based white resist layer 7 is exposed only in the frame region E and in the regions inside the second openings H2 in plan view. Such a feature minimizes adverse effects due to a decrease in light reflectance of the non-silicone-based white resist layer 7.

Third Embodiment

Described next is the backlight 100 including the light-emitting-element-equipped substrate 10 according to a third embodiment with reference to FIGS. 7 to 9. Note that, in description below, identical points between this embodiment and the second embodiment will not be repeated. The backlight 100 of this embodiment is different from that of the second embodiment in that the frame 1 of the backlight 100 of this embodiment includes a protrusion 1C.

Specifically, the frame 1 of the backlight 100 of this embodiment includes: the bottom face 1A; the peripheral wall 1B standing from an outer periphery of the bottom face 1A to surround the bottom face 1A; and the protrusion 1C protruding inward from the peripheral wall 1B. The protrusion 1C is shaped into a frame to cover the frame region E shaped into a frame. The light-emitting-element-equipped substrate 10 is provided between the bottom face 1A and the protrusion 1C. Furthermore, the light-emitting-element-equipped substrate 10 is sandwiched between the protrusion 1C and the bottom face 1A. Hence, the protrusion 1C keeps the protective layer 5 from coming off. Such a feature can more reliably reduce the risk of the circuit substrate 5 delaminating from the protective layer 2.

Fourth Embodiment

Described next is the backlight 100 including the light-emitting-element-equipped substrate 10 according to a fourth embodiment, with reference to FIG. 10. Note that, in the description below, identical points between this embodiment and the third embodiment will not be repeated.

The backlight 100 of this embodiment is different from that of the third embodiment in that each second opening H2 of the backlight 100 of this embodiment is also provided in a region including a midpoint between center points of two of the light-emitting elements 3 adjacent to each other. A center point of a light-emitting element 3 shaped into a rectangle is the intersection of the diagonals of the light-emitting element 3. The silicone-based white resist layer 4 included in the backlight 100 of this embodiment is smaller in area than that included in the backlight 100 of the third embodiment. Hence, the backlight 100 of this embodiment can reduce the risk of the circuit substrate 2 and the protective layer 5 delaminating from each other more reliably than the backlight 100 of the third embodiment does.

Note that, in this embodiment, the non-silicone-based white resist layer 7 may be omitted, and the protective layer 5 and the circuit substrate 2 may be in direct contact with each other.

Fifth Embodiment

Described next is the backlight 100 including the light-emitting-element-equipped substrate 10 according to a fifth embodiment, with reference to FIG. 11. Note that, in the description below, identical points between this embodiment and the third embodiment will not be repeated. The backlight 100 of this embodiment is different from that of the third embodiment in that the second openings H2 in the former backlight 100 are latticed overall. The silicone-based white resist layer 4 included in the backlight 100 of this embodiment is smaller in area than that included in the backlight 100 of the third embodiment. Hence, the backlight 100 of this embodiment can reduce the risk of the circuit substrate 2 and the protective layer 5 delaminating from each other more reliably than the backlight 100 of the third embodiment does.

Note that, in this embodiment, the non-silicone-based white resist layer 7 may be omitted, and the protective layer 5 and the circuit substrate 2 may be in direct contact with each other.

Sixth Embodiment

Described next is the backlight 100 including the light-emitting-element-equipped substrate 10 according to a sixth embodiment, with reference to FIGS. 12 and 13. Note that in the description below, identical points between this embodiment and the third embodiment will not be repeated. The backlight 100 of this embodiment is different from that of the third embodiment in that the main surface 2a of the circuit substrate 2 is curved. The backlight 100 of this embodiment is useful as a curved display 1000 such as a curved liquid crystal display including a liquid crystal panel 20 curved and mounted on a vehicle.

If the main surface 2a of circuit substrate 2 is curved as seen in this embodiment, the light-emitting elements 3 are likely to come off the circuit substrate 2. In this embodiment, however, the adhesion strength between the protective layer 5 and the circuit substrate 2 is increased, reducing the risk that the light-emitting elements 3 comes off the circuit substrate 2.

Note that the main surface 2a of the circuit substrate 2 in this embodiment is curved to be convex outward. Alternatively, the main surface 2a may also be curved be convex inward; that is, curved to have a concave shape facing outside.

The invention claimed is:

1. A light-emitting-element-equipped substrate, comprising:
a circuit substrate including a main surface;
a light-emitting element mounted on the main surface and electrically connected to the circuit substrate;
a silicone-based white resist layer covering the main surface and including: a first opening surrounding the light-emitting element; and a second opening different from the first opening; and
a transparent protective layer covering the light-emitting element, the silicone-based white resist layer, and the second opening.

2. The light-emitting-element-equipped substrate according to claim 1, wherein the second opening is spaced apart from the light-emitting element over a predetermined distance.

3. The light-emitting-element-equipped substrate according to claim 2, wherein
four light-emitting elements including the light-emitting element are each positioned in a corresponding one of imaginary corners of an imaginary rectangle in plan view, and
the second opening is provided in a region including an intersection of diagonals connecting center points of the four light-emitting elements.

4. The light-emitting-element-equipped substrate according to claim 2, wherein
the second opening is provided in a region including a midpoint between center points of two light-emitting elements including the light-emitting element and adjacent to each other.

5. The light-emitting-element-equipped substrate according to claim 2, wherein
a plurality of the second openings are latticed overall.

6. The light-emitting-element-equipped substrate according to claim 1, wherein
the circuit substrate and the transparent protective layer are in direct contact with each other in a region inside the second opening.

7. The light-emitting-element-equipped substrate according to claim 1, further comprising
a non-silicone-based white resist layer between the silicone-based white resist layer and the circuit substrate, wherein
the non-silicone-based white resist layer is found in a region inside the second opening in plan view.

8. The light-emitting-element-equipped substrate according to claim 7, wherein
the non-silicone-based white resist layer is greater in strength to adhere the circuit substrate and the protective layer together than the silicone-based white resist layer.

9. The light-emitting-element-equipped substrate according to claim 7, wherein
the non-silicone-based white resist layer is higher in light reflectance than the main surface.

10. The light-emitting-element-equipped substrate according to claim 7, wherein
the non-silicone-based white resist layer includes an epoxy-based white resist layer.

11. The light-emitting-element-equipped substrate according to claim 1, wherein
the silicone-based white resist layer is provided only to an interior region positioned inside a frame region of the circuit substrate.

12. The light-emitting-element-equipped substrate according to claim 11, wherein
in the frame region, the circuit substrate and the protective layer are in direct contact with each other.

13. The light-emitting-element-equipped substrate according to claim 11, further comprising
a non-silicone-based white resist layer between the circuit substrate and the protective layer, wherein
the non-silicone-based white resist layer is found in the frame region in plan view.

14. The light-emitting-element-equipped substrate according to claim 1, wherein
the main surface of the circuit substrate is curved.

15. The light-emitting-element-equipped substrate according to claim 1, wherein
the circuit substrate includes glass epoxy, polyimide, or aluminum.

16. The light-emitting-element-equipped substrate according to claim 1, wherein
the protective layer includes an acryl-based, epoxy-based, silicone-based, or urethane-based transparent resin layer.

17. A backlight, comprising:
a frame including: a bottom face; a peripheral wall standing from an outer periphery of the bottom face to surround the bottom face; and a protrusion protruding inward from the peripheral wall; and
the light-emitting-element-equipped substrate, according to claim 1, provided between the bottom face and the protrusion.

18. The backlight according to claim 17, wherein
the light-emitting-element-equipped substrate is sandwiched between the protrusion and the bottom face.

19. The backlight according to claim 17, further comprising
an optical sheet provided above the protrusion and configured to change light emitted from the light-emitting element to an area light source.

* * * * *